United States Patent [19]

Etrillard et al.

[11] Patent Number: 5,221,662

[45] Date of Patent: Jun. 22, 1993

[54] SUPERCONDUCTING SCREEN PRINTING INK AND PROCESS FOR PRODUCING A THICK SUPERCONDUCTING FILM USING THIS INK

[75] Inventors: Jackie Etrillard, St. Arnoult en Yuelines; Denise Morin, Nogent sur Marne, both of France

[73] Assignee: France Telecom, Etablissement Autonome de droit public, Paris, France

[21] Appl. No.: 758,885

[22] Filed: Sep. 11, 1991

[30] Foreign Application Priority Data

Sep. 27, 1990 [FR] France ................ 90 11931

[51] Int. Cl.$^5$ ............. H01B 12/06; H01L 39/12
[52] U.S. Cl. ........................ 505/1; 505/741;
106/20 R; 252/521; 252/520; 501/21; 501/32;
501/17
[58] Field of Search ........... 505/1, 741; 106/20;
101/129; 252/521, 520; 501/21, 32, 17, 123,
126, 152

[56] References Cited

U.S. PATENT DOCUMENTS 5,075,282 12/1991 Koinuma et al. ............ 505/741
5,096,878 3/1992 Hoshino et al. ............. 505/741

FOREIGN PATENT DOCUMENTS 0292385 11/1988 European Pat. Off. .
0376865 7/1990 European Pat. Off. .
2-56816 2/1990 Japan ....................... 505/741
03-216602 5/1991 Japan ....................... 505/741

OTHER PUBLICATIONS

Hshino et al., "Preparation of Superconducting Bi-Si--Ca-Cu-O Printed Thick Films on MgO Substrate Arg Ag Metal Tape", Jap. Jou. App. Phy., vol. 27, #7, Jul. 1980, pp. L1297-L1299.

Itoh et al., "Preparation of Superconducting Y-Ba--Cu-O Thick Film", Jap. Jour. Appl. Phys., vol. 27, #3, Mar. 1988, pp. L420-L422.

Patent Abstracts of Japan, vol. 14, No. 34 (C-679), 23 Jan. 1990 and JP1270518, Oct. 1989.

IEEE Transactions on Magnetics, T. W. Button et al., vol. 27, No. 2, Mar., 1991, pp. 1434-1437 (Proceeding Applied Superconductor Conference, Sep. 24 to 28, 1990).

Applied Physics Letters, M. Xu et al., vol. 55, No. 21, Nov. 20, 1989, pp. 2236-2238.

Cryogenics, A. Uusimaki et al., vol. 30, No. 7, Jul., 1990, pp. 593-598.

Japanese Journal of Applied Physics, S. Tsuboi et al., vol. 29, No. 6, Jun., 1990, pp. L896-L899.

*Primary Examiner*—Mark L. Bell
*Assistant Examiner*—C. M. Bonner
*Attorney, Agent, or Firm*—Pearne, Gordon, McCoy & Granger

[57] ABSTRACT

A superconducting screen printing ink comprises an organic composition, a mineral binder and a mineral composition which is a high temperature superconducting Bi-Sr-Ca-Cu-O material or a precursor therefore. A thick superconducting film is produced by screen printing deposition of the ink on a substrate through a mask, drying and then baking the deposited ink. The ink and film are useful in microelectronics.

7 Claims, No Drawings

SUPERCONDUCTING SCREEN PRINTING INK AND PROCESS FOR PRODUCING A THICK SUPERCONDUCTING FILM USING THIS INK

The present invention relates to a superconducting screen printing ink and to a process for producing a superconducting thick film using this ink. It can more particularly be used in microelectronics.

A screen printing ink is an ink which can be deposited on a substrate by screen printing.

In microelectronics, the so-called "thick film" procedure makes it possible to deposit by screen printing in accordance with a desired pattern and through a suitable mask obtained photolithographically, an ink which, after baking, has particular electrical properties. Thus, it is possible to produce hybrid circuits, whose connections and passive components are obtained by screen printing.

The discovery of the superconducting properties of certain ceramics has been rapidly followed by the development of screen printing inks from said ceramics. Such inks can be used for producing by screen printing the superconducting connections of hybrid circuits and which permit faster communications in said circuits and which reduce the significance of heat dissipation problems in such circuits.

The ink according to the invention can also be used in the production of circuits operating in the ultra-high frequency field, said circuits incorporating resonators with a high resonance ratio and said resonators can be produced with superconducting materials.

A screen printing ink must satisfy three requirements:
1. permit printing on a substrate,
2. lead to given electrical properties (e.g. superconducting) and
3. lead to an adequate adhesion to the substrate, as well as to adequate mechanical and chemical strength (resistance to abrasion, scratching, corrosive vapors, etc.).

To this end, a conventional screen printing ink comprises an active material leading to the requisite electrical properties, an organic composition (which generally comprises a temporary binder and a solvent to which is optionally added a wetting agent) and a final mineral binder.

The first of the three aforementioned requirements is satisfied as a result of the organic part of the ink, which generally incorporates on the one hand a resin or a polymer (e.g. ethyl cellulose or polymethacrylate), which forms a temporary binder, which disappears after baking, and on the other hand a slightly volatile solvent (e.g. terpineol). This organic part of the ink has a rheological function and a thixotropic function, which are specific to such an ink.

These characteristics of the screen printing ink must be as times-table as possible.

The second requirement is satisfied by incorporating into the organic part the active material, which has the requisite electrical properties or acquires them after baking.

The third requirement (adhesion to the substrate and mechanical/chemical resistance) is satisfied by incorporating the mineral binder into the organic composition and material having or being capable of acquiring the requisite electrical properties.

Generally, the substrate used is a ceramic material and for obtaining the sealing of said substrate, use is made of a meltable vitreous phase (glass atomized after hardening in water) as the mineral binder. This vitreous phase melts during baking and seals the active material to the ceramic.

Instead of using a meltable vitreous phase as the mineral binder, it is possible to use a reactive binder, so that sealing to the substrate takes place by a chemical reaction.

It is vital that the final mineral binder does not modify the electrical characteristics of the active material used, which is in the form of a mineral powder. In particular, the final mineral binder must have an adequate viscosity, wettability, chemical inertia relative to the active material and expansion coefficient.

However, it has been found that conventional mineral binders destructively interact with the superconducting phases. This is why the known superconducting screen printing inks incorporate no final mineral binder for sealing the superconducting material to the substrate and for protecting said material against scratching and a chemically aggressive environment.

Thus, T. Brousse et al., "Superconducting screen printing thick films of $YBa_2CU_3O_7$ and $Bi_{1.6}Pb_{0.4}Sr_{1.6}Ca_{2.4}Cu_3O_{10}$ on polycrystalline substrates," Appl. Phys. A49, pp. 217-220 (1989), describes the preparation of a superconducting screen printing ink based on the superconducting material PbBiSrCaCuO without a final mineral binder.

A superconducting screen printing ink without a final mineral binder suffers from the following disadvantages. It does not make it possible to guarantee adequate adhesion characteristics of the superconducting material to the substrate on which the ink is deposited by screen printing. This is more particularly applicable in view of the fact that the interaction with the substrate is a parameter having the greatest influence on the superconducting transition of the deposited superconducting material (cf. "Superconductivity and substrate interaction of screen-printed Bi-Sr-Ca-Cu-O films," T. Hashimoto et al., Jap. J. of Appl. Phys., Vol. 27, No. 3 March 1988, p. L384-L386; and "High $T_c$ screen-printed $YBa_2Cu_3O_{7-x}$ films: effect of the substrate material," N. P. Bansal et al., Appl. Phys. Lett. 53(7), 15 Aug. 1988, p. 603 and every effort is made to minimize the duration of the temperature making it possible to produce the chemical bonds responsible for adhesion. The absence of the final mineral binder means that the thick film formed does not have an adequate mechanical strength, so that the film is friable and this can lead to a mechanical deterioration thereof under certain conditions. The absence of a final mineral binder also leads to a limited resistance of the thick film to chemical attacks (due to steam, solvents or tinning). Without a final mineral binder, it is difficult to make a screen printing ink compatible with conventional inks, which incorporate a final mineral binder.

The present invention aims at obviating the aforementioned disadvantages. It relates to a superconducting screen printing ink incorporating an organic composition and a mineral composition, which forms a superconducting material or which, after baking, is able to give a superconducting material, characterized in that it also comprises a mineral binder, which is chemically inert to the semiconducting material.

Preferably, the mineral composition comprises a powder constituted by crystals of the superconducting material. This superconducting material can be a superconducting oxide Bi-Sr-Ca-Cu-0.

The mineral binder can be in solid form or in organometallic form. Thus, e.g. the mineral binder can be constituted by a powder of a ceramic based on metallic oxides of indium and tin.

After deposition by screen printing, baking and drying, said ceramic envelops the superconducting crystals formed without modifying their electrical characteristics. Moreover, said ceramic is compatible with commercially available inks based on gold and palladium.

The invention also relates to a process for producing a thick superconducting film, which comprises a deposition by screen printing on a substrate and through a mask of a superconducting screen printing ink according to the invention, drying and then baking of the deposited ink.

The invention will be better understood from the following examples given in a purely indicative and in no way limitative manner.

Thus, the following procedure is used for preparing an ink according to the invention. Use is made of superconducting BiPbSrCaCuQ pellets obtained by conventional methods described elsewhere (cf. e.g. "Formation conditions of the (2223) phase in lead-substituted superconducting ceramics Bi-Sr-Ca-Cu-O," L. Pierre, et al., Sold State Comm., 69, 502 (1989). The pellets are crushed in order to obtain a fine active powder, constituted by superconducting crystals. Following said crushing operation, a double screening of the powder is carried out in order to eliminate therefrom the very small crystals with a mean diameter below 5 micrometers, as well as the large crystals with a mean diameter exceeding 50 micrometers.

In the example in question, it is possible to use as the mineral binder a powder of indium oxide and tin oxide.

The minimum mineral binder quantity possible is used and therefore the active powder (constituted by small superconducting crystals) is incorporated into the mineral binder, which is itself incorporated into the organic composition having the ink. The latter is a mixture of terpineol and a polymethacrylate or ethyl cellulose.

Instead of using a mineral binder in solid form, it is possible to use a mineral binder in organometallic form which, during the subsequent baking of the ink deposited by screen printing, decomposes in order to lead to the desired sealing and which e.g. incorporates organometallic compounds of indium and tin. For example, said mineral binder in organometallic form is present in the composition of the ink in a proportion of 10% by weight.

The use of a mineral binder in organometallic form permits a better "diffusion" of said mineral binder into the mixture formed, which leads to a better enveloping or coating of the superconducting crystals.

After dispersing the superconducting crystals and the mineral binder in the organic composition by means of a mixer or a ball mill, the mixture obtained is e.g. worked or kneaded by means of mixing rolls. This gives a paste with appropriate rheological properties. The thus obtained paste is used for forming a thick superconducting film on a substrate, e.g. a MgO ceramic.

This is followed by screen printing through a mask having an opening making it possible to obtain the desired form for the film. Experimentally, it is possible to use a conventional screen (e.g. 125 mesh).

Following screen printing, the deposited film is dried for 30 minutes at 120° C. and then baked in a conventional oven with a baking profile having a limited temperature rise and fall speed (e.g. 150° C./h), whilst being maintained at a level for 5 hours.

In order to carry out superconductivity tests on the thick film obtained, it is screen printed onto gold-palladium electrodes, which are produced with a commercially available ink.

By observing the film obtained after baking using an electron scanning microscope, it can be seen that the mineral binder envelops the superconducting microcrystals of the film and said mineral binder is observed on the surface of the planar superconducting crystals. This mineral binder does not modify the properties of the deposited superconducting material.

No adhesion deficiency is observed following a tear-off test, contrary to what is observed using the same patterns produced with an ink incorporating the same products, with the exception of the mineral binder, in the same proportions.

An analysis by X-ray energy dispersion (EDX) of the thick film formed leads to a spectrum having, apart from characteristic lines of the superconducting material formed, the lines due to the mineral binder used (In and Sn lines).

Moreover, the electrical characterization of said thick film reveals a superconducting transition at 104K (the measurements being performed using the four point method) with a critical current of approximately $100A.cm^2$, which constitutes a significant advance compared with inks not having a mineral binder T. Brousse et al., "Superconducting screen printing thick films of $YBa_2Cu_3O_7$ and $Bi_{1.6}Pb_{0.4}Sr_{1.6}Ca_{2.4}Cu_3O_{10}$ on polycrystalline substrates," Appl. Phys. A49, pp. 217-220 (1989).

We claim:

1. Superconducting screen printing ink comprising ann organic composition, a mineral binder and a mineral composition, said mineral composition comprising a high temperature superconducting Bi-Sr-Ca-Cu-O material or a precursor composition thereof, said mineral binder being chemically inert to the superconducting material.

2. Ink according to claim 1, wherein the mineral composition comprises a powder constituted by crystals of the superconducting material.

3. Ink according to claim 1, wherein the mineral binder is a solid.

4. The ink according to claim 1, wherein the mineral binder is an organometallic binder having a different composition than the superconducting material or precursor composition, thereof.

5. Superconducting screen printing ink comprising an organic composition, a mineral binder and a mineral composition which is a high temperature superconducting material or a precursor composition thereof, said mineral binder being chemically inert to the superconducting material and comprising indium oxide and tin oxide.

6. Superconducting screen printing ink comprising an organic composition, a mineral binder and a mineral composition which is a high temperature superconducting material or a precursor composition thereof, said mineral binder being chemically inert to the superconducting material and comprising organometallic indium and tin compounds.

7. Superconducting screen printing ink comprising an organic composition, a mineral binder, and a mineral composition which is a high temperature superconducting material or precursor composition thereof, said mineral binder being chemically inert to the superconducting material and comprising an organometallic binder having a different composition that the superconducting material or precursor composition, thereof.

* * * * *